(12) United States Patent  
Sharon

(10) Patent No.: US 7,716,415 B2  
(45) Date of Patent: May 11, 2010

(54) METHOD OF AVOIDING ERRORS IN FLASH MEMORY

(75) Inventor: Eran Sharon, Rishon Lezion (IL)

(73) Assignee: Sandisk IL Ltd., Kfar Saba (IL)

( * ) Notice: Subject to any disclaimer, the term of this patent is extended or adjusted under 35 U.S.C. 154(b) by 377 days.

(21) Appl. No.: 11/797,379

(22) Filed: May 3, 2007

(65) Prior Publication Data

US 2008/0031042 A1    Feb. 7, 2008

Related U.S. Application Data

(60) Provisional application No. 60/820,960, filed on Aug. 1, 2006.

(51) Int. Cl.  
*G06F 12/00* (2006.01)

(52) U.S. Cl. .............. 711/103; 365/189.07; 365/210.14

(58) Field of Classification Search .................. 711/103  
See application file for complete search history.

(56) References Cited

U.S. PATENT DOCUMENTS

| 5,434,825 A | 7/1995 | Harari |
| 6,522,580 B2 * | 2/2003 | Chen et al. ............. 365/185.02 |
| 6,684,289 B1 * | 1/2004 | Gonzalez et al. ............ 711/103 |
| 2004/0255090 A1 | 12/2004 | Guterman et al. |
| 2006/0101193 A1 | 5/2006 | Murin |

* cited by examiner

*Primary Examiner*—Hamdy S Ahmed  
(74) *Attorney, Agent, or Firm*—Toler Law Group

(57) ABSTRACT

Whenever N data bits are stored in a cell of a memory that programs each of its cells to represent any one of $2^N$ different patterns of N>1 bits as a respective one of $2^N$ ordered cell states, the N data bits are mapped to a transformed pattern of N bits according to a transformation that maps the pattern of the lowest state (typically all 1's) to a different pattern, and the cell is programmed to represent the transformed pattern. The transformation may invert all, some or only one of the bits of each pattern. Whenever the cells of the memory are read, the transformation is inverted.

9 Claims, 5 Drawing Sheets

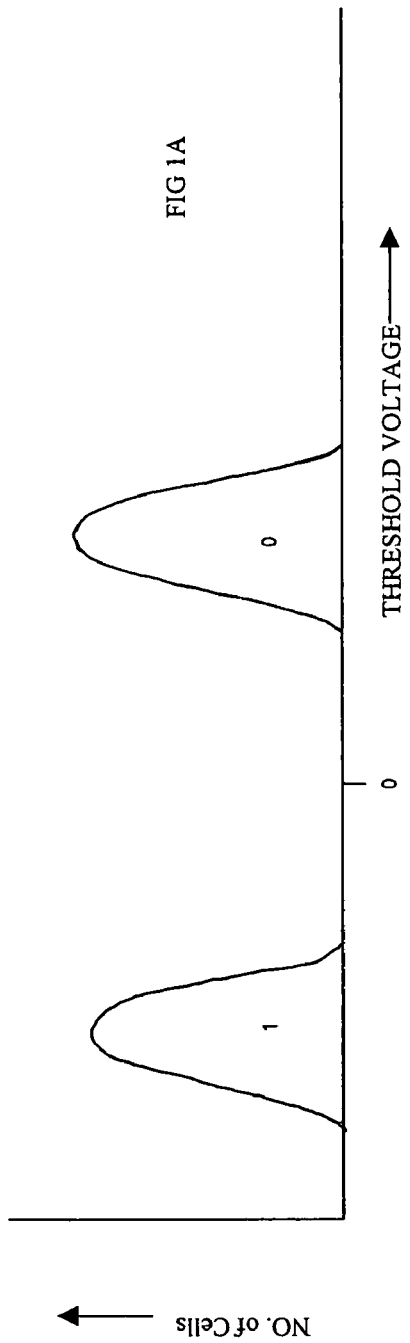
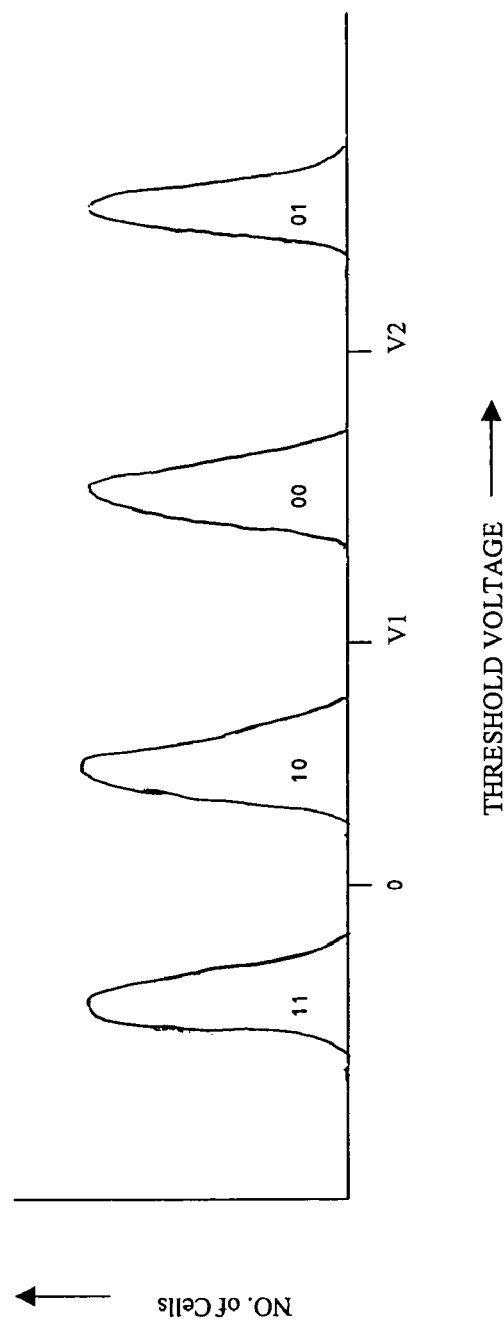

METHOD OF AVOIDING ERRORS IN FLASH MEMORY

This patent application claims the benefit of U.S. Provisional Patent Application No. 60/820,960, filed Aug. 1, 2006

FIELD AND BACKGROUND OF THE INVENTION

The present invention relates generally to flash memory storage systems. More particularly, the present invention relates to flash memory storage systems in which the flash memory is capable of storing multiple bits per memory cell, and in which certain disturbance effects are minimized.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell—if the threshold voltage is in the higher state then the bit value is "0" and if the threshold voltage is in the lower state then the bit value is "1". Actually there is no need to accurately read the cell's threshold voltage—all that is needed is to correctly identify in which of the two states the cell is currently located. For that purpose it suffices to make a comparison against a reference voltage value that is in the middle between the two states, and thus to determine if the cell's threshold voltage is below or above this reference value.

FIG. 1A shows graphically how this works. Specifically, FIG. 1A shows the distribution of the threshold voltages of a large population of cells. Because the cells in a flash device are not exactly identical in their characteristics and behavior (due, for example, to small variations in impurity concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory. The terms "writing" and "programming" are used interchangeably herein.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash device has appeared on the market, using a technique conventionally called "Multi Level Cells" or MLC for short. (This nomenclature is misleading, because the previous type of flash cells also has more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two bits in each cell. (In principle MBC also includes the storage of more than two bits per cell. In order to simplify the explanations, the two-bit case is emphasized herein. It should however be understood the present invention is equally applicable to flash memory devices that support more than two bits per cell.) In order for a single cell to store two bits of information the cell must be able to be in one of four different states. As the cell's "state" is represented by its threshold voltage, it is clear an MBC cell should support four different valid ranges for its threshold voltage. FIG. 1B shows the threshold voltage distribution for a typical MBC cell. As expected, FIG. 1B has four peaks, each corresponding to one of the states. As for the SBC case, each state is actually a range of threshold voltages and not a single threshold voltage. When reading the cell's contents, all that must be guaranteed is that the range that the cell's threshold voltage is in is correctly identified. For a prior art example of an MBC flash device see U.S. Pat. No. 5,434,825 to Harari.

When encoding two bits in an MBC cell as one of the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are illustrated as assigned in the following order from left to right—"10", "00", "01". One can see an example of an implementation of an MBC NAND flash device using such encoding as described above in U.S. Pat. No. 6,522,580 to Chen, which patent is incorporated by reference for all purposes as if fully set forth herein. See in particular FIG. 8 of the Chen patent. It should be noted though that the present invention does not depend on this assignment of the states, and there are other ordering that can be used. When reading an MBC cell's content, the range that the cell's threshold voltage is in must be identified correctly; only in this case this cannot always be achieved by comparing to one reference voltage, and several comparisons may be necessary. For example, in the case illustrated in FIG. 1B, one way to read the lower bit is first to compare the cell's threshold voltage to a reference comparison voltage $V_1$ and then, depending on the outcome of the comparison, to compare the cell's threshold voltage to either a zero reference comparison voltage or a reference comparison voltage $V_2$. Another way to read the lower bit is to compare the cell's threshold voltage unconditionally to both the zero reference voltage and $V_2$. In either case, two comparisons are needed.

MBC devices provide a great advantage of cost—using a similarly sized cell one stores two bits rather than one. However, there are also some drawbacks to using MBC flash—the average read and write times of MBC memories are longer than of SLC memories, resulting in lower performance. Also, the reliability of MBC is lower than SBC. This can easily be understood—the differences between the threshold voltage ranges in MBC are much smaller than in SBC. Thus, a disturbance in the threshold voltage (e.g. leaking of the stored charge causing a threshold voltage drift, interference from operations on neighboring cells, etc.) that may have gone unnoticed in SBC because of the large gap between the two states, might cause an MBC cell to move from one state to another, resulting in an erroneous bit. The end result is a lower quality specification of MBC cells in terms of data retention time or the endurance of the device to many write/erase cycles. Thus there are advantages to using both MBC cells and SBC cells, and the selection can be different depending on the application's requirements.

While the above explanations deal with floating-gate flash memory cells, there are other types of flash memory technologies. For example, in the NROM flash memory technology there is no conductive floating gate but instead there is an insulating layer trapping the electric charge. The present invention is equally applicable to all flash memory types, even though the explanations herein are given in the context of floating-gate technology.

There are several sources of errors in flash memory devices. As mentioned above, one such source is the leakage of electrons out of the gate of a memory cell that might shift the cell's originally written state into another, incorrect state, resulting in one or more bit errors when reading the cell. The present invention is mainly concerned with a specific source of error commonly called "Program Disturb" or "PD" for short. Unlike the leakage-type effect that results in slow accumulation of errors over long time periods in which data is stored in the flash device, the PD effect results in an immediate appearance of errors, immediately following the writing of data into the cells of the device.

The PD effect causes cells, that are not intended to be written, to unintentionally move from their initial left-most state to some other state. (The explanations herein assume the common practice, also used in FIGS. 1A and 1B, of drawing the threshold voltage axis such that its left direction represents lower values. This is an arbitrary practice and should not be construed to limit the scope of the present invention in any way). Referring to the two-bit-per-cell example of FIG. 11B, cells that are in the leftmost state corresponding to bit values of "11" (or in other words, to the cell's erased state) and that are supposed to remain in such state, are found to be in the next-to-leftmost state of "10", resulting in one bit out of the two bits stored in such cells to be incorrect. In some cases, especially in cells storing more than two bits per cell and having more than four states, PD effects might turn out not only as a move from the leftmost state to its immediately adjacent state, but also as a move from the leftmost state to more distant states, and also as a move from a state that is not the leftmost state to another state to its right (i.e. having a higher threshold voltage). However, the case described first above of moving from the leftmost state to its immediately adjacent neighboring state is the most common, and will be used herein for all examples and explanations without limiting the generality of the methods of the present invention.

By way of background for a discussion of the reason for the PD effect, FIG. 2, which is identical to FIG. 1 of the Chen patent, is a block diagram of a typical prior art flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a program operation, and for controlling voltage levels of the bit lines (BL) to promote the programming or to inhibit the programming. Row control circuit 3 is connected to word lines (WL) to select one of the word lines (WL), to apply read voltages, to apply programming voltages combined with the bit line voltage levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage. Typically, in a NAND flash device, the cells controlled by one word line correspond to one or two pages of the device.

The data stored in the memory cells (M) are read out by column control circuit 2 and are output to external I/O lines via an I/O line and a data input/output buffer 6. Program data to be stored in the memory cells are input to data input/output buffer 6 via the external I/O lines, and are transferred to the column control circuit 2. The external I/O lines are connected to a controller 20.

Command data for controlling the flash memory device are input to a command interface connected to external control lines that are connected with controller 20. The command data informs the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host that initiates commands, such as to store or read data to or from memory array 1, and provides or receives such data, respectively. Controller 20 converts such commands into command signals that can be interpreted and executed by command circuits 7. Controller 20 also typically contains buffer memory for the user data being written to or read from memory array 1. A typical memory system includes one integrated circuit chip 21 that includes controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

The reason for the PD effect is easy to understand when reviewing the voltages applied to the cells of a NAND flash device when programming a page. When programming a page of cells, a relatively high voltage is applied to the word line connected to the control gates of the cells of the page. What decides whether a certain cell threshold voltage is increased as a result of this control gate voltage is the voltage applied to the bit line connected to that cell. A cell that is not to be written with data (that is—that is to remain erased, representing an all-one state), has its bit line connected to a relatively high voltage level that minimizes the voltage difference across the cell. A cell that is to be written has its bit line connected to low voltage, causing a large voltage difference across the cell, and resulting in the cell's threshold voltage getting increased, thus moving the cell to the right on the voltage axis of FIG. 1B and causing the cell's state to change.

However, even though cells that are not meant to be written have a lower voltage difference across them than cells that are meant to be written, the cells that are not to be written still have some voltage difference across them. If the page to be written has some cells that are written to high threshold voltages (for example, to the rightmost state), then the voltage difference across non-programmed cells gets higher. This is because all control gates of all cells of the page get the same voltage applied to them, and the higher the threshold voltage to be reached, the higher is that voltage. Therefore the need to apply higher control gate (i.e. word line) voltage to some cells results in higher voltage differences at the non-programmed cells. Even though the cells are designed with the goal of not being affected by such anticipated voltage differences, in actual NAND flash devices such voltage differences stress the cells and might result in some of the cells changing their state even though this was neither intended nor desired.

To summarize the above explanation, PD is an effect in which when programming a page of cells, some cells that are intended to remain in the leftmost erased state end up in another state, resulting in bit errors when reading those cells.

PD effects can be empirically and statistically measured, and counter-measures in the form of error correction schemes may be applied to handle them. Flash device manufacturers are aware of this source of potential errors, and they take it into account when recommending to their customers the level of error correction the customers should use. So when a manufacturer of a two-bit-per-cell MBC flash device recommends a 4-bit ECC scheme (meaning that every 512 bytes of user data should be protected against the occurrence of up to four bit errors), he may base this recommendation on a statistical analysis that assumes a random data pattern stored into the device and on the probability that a PD-type error will occur under such circumstances. Obviously, other error sources and types are also taken into account in such calculations.

Unfortunately, typical real-life user data is not random. Measurements on real-life user files show that the various possible states of the cells do not have equal probability to occur. As the leftmost state of the cells is the default value of cells not being written to, this state is the most frequent. This is easy to understand—a section of memory not initialized, or not used within a file, very often corresponds to cells in the erased state.

As a result, in real-life applications the problem of PD errors is more severe than what is expected based on random data patterns statistical calculations. Relatively many cells will be in the erased state that is the most vulnerable state to PD errors, and therefore more PD errors than are predicted by random data distribution models will actually occur.

There is thus a widely recognized need for, and it would be highly advantageous to have, a flash memory device that is more reliable than prior art flash memory devices in the sense of being less vulnerable to PD errors when used in real-life scenarios.

SUMMARY OF THE INVENTION

According to the present invention there is provided a method of storing data, including the steps of: (a) providing a memory that includes at least one cell and that is operative to program each cell to represent any one of $2^N$ different patterns of N>1 bits as a respective one of $2^N$ ordered states of the each cell; (b) defining a transformation that maps each pattern of N bits into a corresponding transformed pattern of N bits, with the pattern of N bits that is programmed by the memory as a lowest one of the states being mapped into a different one of the patterns of N bits; and (c) whenever receiving N data bits to store in one of the at least one cell: (i) mapping the N data bits to one of the transformed patterns of N bits according to the transformation, and (ii) programming the one cell to the state that represents the one transformed pattern of N bits.

According to the present invention there is provided a memory device including: (a) a memory that includes at least one cell; (b) circuitry for programming each cell to represent any one of $2^N$ different patterns of N>1 bits as a respective one of $2^N$ ordered states of the each cell, with one of the patterns of N bits being represented as a lowest state; and (c) a controller that is operative: (i) to receive N data bits to store in one of the at least one cell, (ii) using a transformation that maps each pattern of N bits into a corresponding transformed pattern of N bits, with the pattern of N bits that is programmed by the circuitry as a lowest one of the states being mapped into a different one of the patterns of N bits: to always map the N data bits into one of the transformed patterns of N bits according to the transformation, and (iii) to send the one transformed pattern of N bits to the circuitry, the circuitry then programming one of the at least one cell to represent the one transformed pattern of N bits.

According to the present invention there is provided a system for storing data, including: (a) a memory device that includes: (i) a least one cell, and (ii) circuitry for programming each cell to represent any one of $2^N$ different patterns of N>1 bits as a respective one of $2^N$ ordered states of the each cell, with one of the patterns of N bits being represented by a lowest state; and (b) a host, of the memory device, that includes a processor operative: (i) to provide N data bits to be stored in one of the at least one cell, (ii) using a transformation that maps each pattern of N bits into a corresponding transformed pattern of N bits, with the pattern of N bits that is programmed by the circuitry as a lowest one of the states being mapped into a different one of the patterns of N bits: to always map the N data bits into one of the transformed patterns of N bits according to the transformation, and (iii) to send the one transformed pattern of N bits to the memory device, the circuitry of the memory device then programming one of the at least one cell to represent the one transformed pattern of N bits.

According to the present invention there is provided a computer-readable storage medium having computer-readable code embedded thereon, the computer-readable code for storing any N>1 data bits in a memory that includes at least one cell and that is operative to program each cell to represent any one of $2^N$ different patterns of N bits as a respective one of $2^N$ ordered states of the each cell, the computer-readable code including: (a) program code for: using a transformation that maps each pattern of N bits into a corresponding transformed pattern of N bits, with the pattern of N bits that is programmed as a lowest one of the states being mapped into a different one of the patterns of N bits: always transforming the N data bits into one of the transformed patterns of N bits according to the transformation; and (b) program code for sending the one transformed pattern of N bits to the memory for storage therein by programming one of the at least one cell to represent the one transformed pattern.

According to the present invention there is provided a method of storing data, including the steps of: (a) providing a memory that includes at least one cell and that is operative to place each cell in a selected one of $2^N$ different ordered states, wherein N>1; and (b) whenever receiving a pattern of N 1's as input data to store in the memory: placing one of the at least one cell in one of the states other than a lowest state to represent the input data.

According to the present invention there is provided a memory device including: (a) a memory that includes at least one cell; and (b) a mechanism that is operative to store N>1 data bits in any one of the at least one cell by placing the any one cell in a selected one of $2^N$ different ordered states, wherein the state that is used to store a bit pattern of N 1's always is one of the states other than a lowest state.

According to the present invention there is provided a system for storing data, including: (a) a memory device that includes a memory having at least one cell; (b) a host of the memory device for providing N>1 data bits to store in one of the at least one cell; and (c) a mechanism that is operative to store the N data bits in any one of the at least one cell by placing the any one cell in a selected one of $2^N$ different ordered states, wherein the state that is used to store a bit pattern of N 1's always is one of the states other than a lowest state.

According to the present invention there is provided a method of reading data that have been stored in a cell of a memory by programming the cell to one of $2^N$ ordered states, each of which states represents a respective one of $2^N$ different patterns of N>1 bits, the method including the steps of: (a) defining a transformation that maps each pattern of N bits into a corresponding transformed pattern of N bits, with the pattern of N bits that is programmed by the memory as a lowest one of the states being mapped to a different one of the patterns of N bits; and (b) whenever reading the data stored in the cell: (i) determining a stored pattern of N bits that is represented by the state of the cell, and (ii) mapping the stored pattern of N bits to a read pattern of N bits according to an inverse of the transformation.

According to the present invention there is provided a memory device including: (a) a memory that includes at least one cell; (b) circuitry for programming each cell to represent any one of $2^N$ different patterns of N>1 bits as a respective one of $2^N$ ordered states of the each cell, with one of the patterns of N bits being represented as a lowest state; and (c) a controller that is operative to always read data, that have been stored in any one of the at least one cell by steps including: (i) determining a stored pattern of N bits that is represented by the state of the any one cell, and (ii) mapping the stored pattern of N bits to a read pattern of N bits according to an inverse of a transformation that maps each pattern of N bits into a corresponding transformed pattern of N bits, with the pattern of N bits that is programmed by the circuitry as a lowest one of the states being mapped to a different one of the patterns of N bits.

According to the present invention there is provided a system for storing and reading data, including: (a) a memory device that includes: (i) at least one cell, and (ii) circuitry for programming each cell to represent any one of $2^N$ different patterns of N>1 bits as a respective one of $2^N$ ordered states of the each cell, with one of the patterns of N bits being represented by a lowest state; and (b) a host, of the memory device, that includes a processor operative to always read data, that have been stored in any one of the at least one cell by steps including: (i) determining a stored pattern of N bits that is represented by the state of the any one cell, and (ii) mapping the stored pattern of N bits to a read pattern of N bits according to an inverse of a transformation that maps each pattern of N bits into a corresponding transformed pattern of N bits, with the pattern of N bits that is programmed by the circuitry as a lowest one of the states being mapped to a different one of the patterns of N bits.

According to the present invention there is provided a computer-readable storage medium having computer-readable code embedded thereon, the computer-readable code for reading data stored in a cell of a memory that is operative to program the cell to represent any one of $2^N$ different patterns of N>1 bits as a respective one of $2^N$ ordered states of the cell, the computer-readable code including program code for: whenever reading the data stored in the cell: (a) determining a stored pattern of N bits that is represented by the state of the cell; and (b) mapping the stored pattern of N bits to a read pattern of N bits according to an inverse of a transformation that maps each pattern of N bits into a corresponding transformed pattern of N bits, with the pattern of N bits that is programmed by the memory as a lowest one of the states being mapped to a different one of the patterns of N bits.

A first aspect of the present invention is a method of storing data. The data are stored in a memory that includes one or more cells. The memory is operative to program its cell, or to program each of its cells, to represent any one of $2^N$ different patterns of N>1 bits as a respective one of $2^N$ ordered states of the cell. For example, if N=2, the memory could be operative to program the cell, or to program each of its cells, to represent one of the four bit patterns {"11", "10", "00", "01"} as one of the four threshold voltage ranges shown in FIG. 1B. Note that the threshold voltage ranges shown in FIG. 1B are ordered from a lowest threshold voltage range to a highest threshold voltage range. A transformation is defined that maps each of the N bit patterns into a corresponding transformed bit pattern, with the bit pattern that is programmed by the memory as a lowest one of the states being mapped into a different one of the bit patterns. In the example of FIG. 1B, this means mapping "11" into "10", "00" or "01". Whenever N data bits are received to store in the cell, or in one of the cells, the received bit pattern is mapped to one of the transformed bit patterns and the cell is programmed to the state that represents the transformed bit pattern rather than to the state that represents the received bit pattern. That the received bit pattern always is mapped to a transformed bit pattern in this manner prior to programming the cell distinguishes the present invention from the invention of Gonzalez et al., U.S. Pat. No. 6,684,289. As described below, Gonzalez et al. may sometimes map a received bit pattern to a transformed bit pattern in this manner and may sometimes not map a received bit pattern to a transformed bit pattern in this manner.

Preferably, the states are different threshold voltage ranges of the cell being programmed.

Preferably, the bit pattern that is programmed by the memory into the lowest state is a pattern of N 1's.

Preferably, the transformation is 1:1 and onto.

In one preferred class of embodiments of the present invention, the transformation inverts all the bits of every bit pattern. In the example of FIG. 1B, "11" is mapped to "00", "10" is mapped to "01", "00" is mapped to "11" and "01" is mapped to "10". Note that this exemplary transformation is 1:1 and onto.

In another preferred class of embodiments of the present invention, the transformation inverts only a portion of the bits of every bit pattern. One such exemplary transformation, in the context of FIG. 1B, maps "11" to "10", "10" to "11", "00" to "01" and "01" to "00". Note that this exemplary transformation, too, is 1:1 and onto.

In a third preferred class of embodiments of the present invention, the transformation inverts one and only one bit of every bit pattern. For example, if N=3, one of "110", "101" or "011", but no other bit pattern, could be mapped into "111".

Preferably, the lowest state is an erased state of the cell being programmed. Alternatively, the memory is operative to place the cell being programmed in an erased state that is lower than any of the $2^N$ states to which the cell could be programmed.

The scope of the present invention also includes a memory device that stores data using this method, a system for storing data using this method, and a computer-readable storage medium bearing computer-readable code for implementing this method.

A second aspect of the present invention also is a method of storing data. The data are stored in a memory that includes one or more cells. The memory is operative to place its cell, or to place each of its cells, in a selected one of $2^N$ different ordered states, wherein N>1. The four ordered (from lowest to highest) threshold voltage ranges of FIG. 1B is an example of such ordered states for N=2. Whenever a pattern of N1's is received as input data to store in the memory, the memory's cell, or one of the memory's cells, is placed in one of the states other than the lowest state to represent those input data.

Preferably, the states of the cell(s) are threshold voltage ranges of the cell(s).

Preferably, the lowest state is an erased state of the cell(s). Alternatively, the memory is operative to place the cell, or each of the cells, in an erased state that is lower than any of the $2^N$ states that the cell or cells is/are placed in to represent data.

The scope of the present invention also includes a memory device that stores data using this method and a system for storing data using this method. The system includes a memory device that includes one or more cells and a host of the memory device. Preferably, in the memory device, the mechanism that effects the method is implemented in circuitry for programming the cell(s). Alternatively, at least a portion of the mechanism that effects the method is implemented in a controller of the memory device. Preferably, in the system, the mechanism that effects the method is implemented in circuitry of the memory device for programming the cell(s). Alternatively, at least a portion of the mechanism that effects the method is implemented in a controller of the memory device. Alternatively, at least a portion of the mechanism that effects the method is implemented in the host.

A third aspect of the present invention is a method for reading data that have been stored in a cell of a memory by programming the cell to one of $2^N$ ordered states, each of which states represents a respective one of $2^N$ different patterns of N>1 bits. A transformation is defined that maps each of the N bit patterns into a corresponding transformed bit pattern, with the bit pattern that is programmed by the memory as a lowest one of the states being mapped into a different one of the bit patterns. Whenever data are read from the cell, a stored bit pattern that is represented by the state of the cell is determined and that stored pattern is mapped to a read bit pattern according to the inverse of the transformation. That the stored bit pattern always is mapped to a read bit pattern in this manner distinguishes the present invention from the invention of Gonzalez et al. Note that this method of reading applies only to a cell that actually has been programmed to store data. For example, as described below, preferably, a cell that has been erased but has not been programmed since that erasure is read without mapping the stored bit pattern into a read bit pattern.

The scope of the present invention also includes a memory device that reads stored stores data using this method, a system for reading stored data using this method, and a computer-readable storage medium bearing computer-readable code for implementing this method.

BRIEF DESCRIPTION OF THE DRAWINGS

The invention is herein described, by way of example only, with reference to the accompanying drawings, wherein:

FIG. 1A illustrates the threshold voltage distributions of flash cells programmed in 1-bit mode;

FIG. 1B illustrates the threshold voltage distributions of flash cells programmed in 2-bit mode;

DESCRIPTION OF THE PREFERRED EMBODIMENTS

Figure 2:
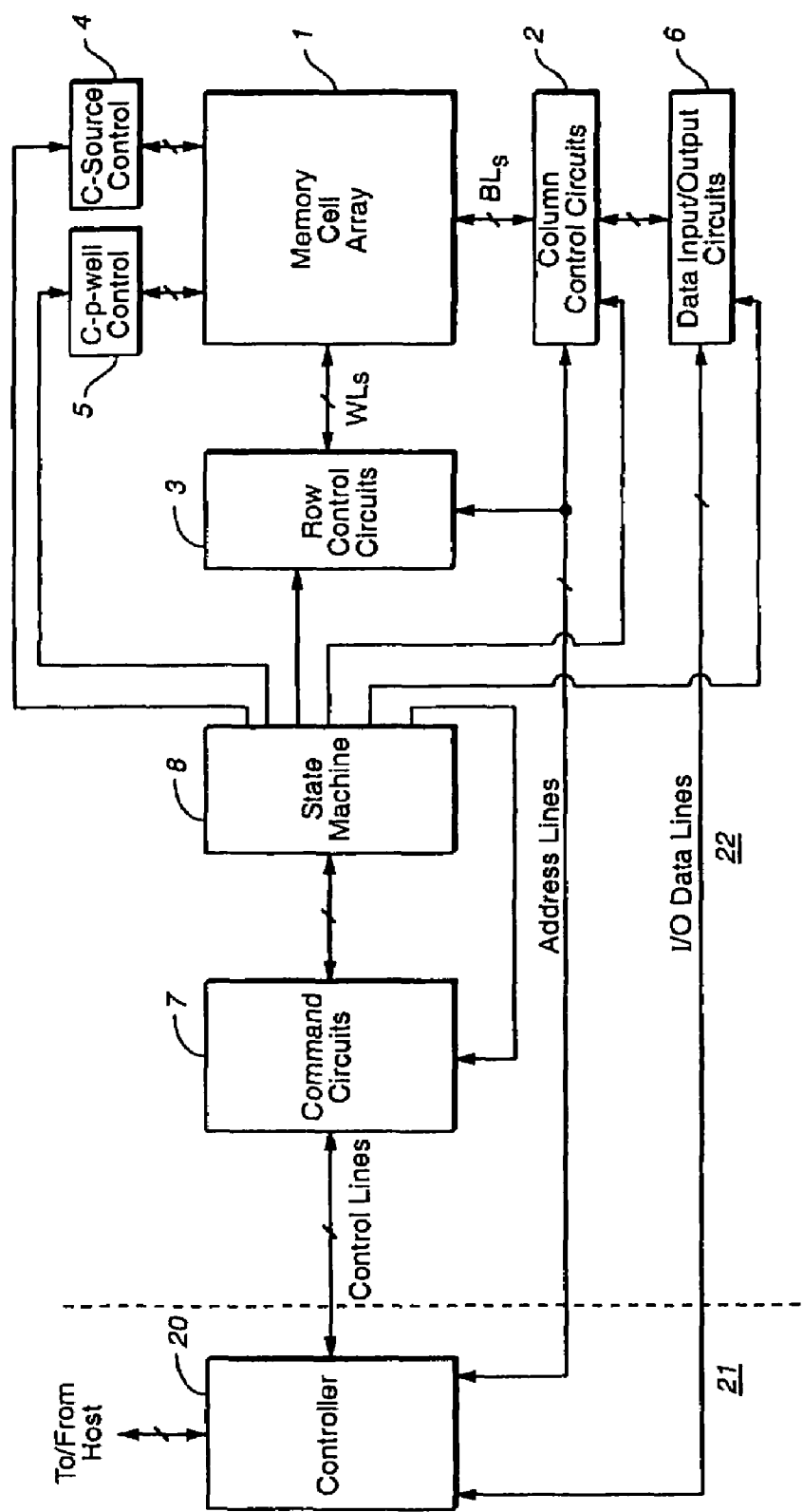
FIG. 2 is a block diagram of a flash memory device.

The present invention is a multi-bit-per-cell flash memory storage device that reduces the effects of PD errors, and the method by which the device reduces the effect of PD errors. The reduction of PD errors is achieved by making the cells' default all-one state a middle state along the threshold voltage axis, instead of the leftmost state as in prior art devices.

The principles and operation of a multi-bit-per-cell flash memory according to the present invention may be better understood with reference to the drawings and the accompanying description.

In the context of the example of FIG. 1B, a flash memory device of the present invention does not have the value of "11" represented by the leftmost state but for example by the third-from-the-left state. Thus the order of the states from left to right is not {"11", "10", "00", "01"} as in FIG. 1B, but may be for example {"00", "01", "11", "10"}. In this case, cells which are to contain values of "11", which as we indicated below are quite common, are written to the third-from the-left state. Therefore all such cells containing "11" are not affected by PD errors. It is true that now all cells containing "00" are vulnerable to PD errors, but as such cells are less frequent in real-life use of the flash device, the overall expected probability of PD errors is reduced.

In order to take advantage of the present invention there is no need to design new architectures of flash memory devices. The invention is easily applicable to standard NAND flash technology as it exists in the market. The desired result of having the all-one state not being located in the leftmost state can be achieved by applying a simple transformation to the bits to be stored. In the example shown above this was achieved by inverting each and every bit before writing it into the cells, and then inverting each and every bit after reading it from the cells. Thus while the user believes he stores "11" into a cell, the flash device is actually instructed to store there "00". Therefore the cell is put into the third state from the left and does not suffer PD errors. Then when reading the data, the cell provides a value that would be considered as "00" in prior art flash devices, but the data is inverted again and the user correctly receives a "11" reading.

While the above example showed a transformation in which all bits are inverted, this is not necessarily the only possible one. For example, only a single bit of the bit pattern to be stored in the cell may be inverted. Or the transformation may involve more complex operations, not limited to inversion. A transformation table may be employed for finding out the values that correspond to the user's data that should physically be sent to the cell. The only essential characteristic of the applied transformation is that the all-ones value is transformed to a state of the cell that is not the leftmost one.

It should be noted that the above method of applying a transformation to the data bits assumes that the cell is being written. When a cell is physically erased into the leftmost state and before the cell is being written according to the methods of the present invention, the cell represents a value of "11" but is still in the leftmost state. This can be handled by the application using the flash memory device being able to distinguish a page that was not written yet from a page that was written. This is easy to do and is well known in the prior art of flash management systems, for example by allocating one or more flag cells that are always written as part of the page programming operation, and thus if found to be in the leftmost state, indicate an unwritten page. So a page found to be unwritten is interpreted according to the standard prior art logic, while a page found to be written is interpreted according to the methods of the present invention. As unwritten pages do not have PD errors (as PD errors are only introduced during the programming operation), there is no risk of PD errors in still-unwritten pages according to this solution.

It should be understood that the idea of a translation stage in which logical bit values that are to be stored in a storage device are translated into physical values that are the ones actually stored, is known in the prior art. This idea is already presented in U.S. patent application Ser. No. 11/061,634 to Lasser, filed Feb. 22, 2005. However, not only is the translation of Lasser done for a completely different purpose than the purpose of the present invention, but the translation of Lasser lacks the specific feature that makes the translation of the present invention useful. The essential characteristic of a translation used in the present invention is that the all-ones logical state of a cell is translated into a physical state different from the leftmost state at the writing stage. In Lasser the purpose of the translation is to even out distribution of errors, and that purpose is not served by transforming the all-ones logical state to any specific physical state. Indeed, all transformation examples shown in Lasser show the all-ones logical state being mapped to the leftmost physical state.

Gonzalez et al., in U.S. Pat. No. 6,684,289, also teaches mapping between logical bit values and physical bit values when writing and reading a flash memory, for the purpose of avoiding repeated programming of static patterns of data (see column 6 lines 28-47). Not only do the teachings of Gonzalez et al. have nothing to do with the minimizing of probability of PD errors of the stored bits, but Gonzalez et al. also apply a time-varying transformation such that the same logical data value is transformed to different physical states at different times, as otherwise the goal of avoiding repeated programming of static data patterns is not achieved. The present invention, on the other hand, applies a transformation that is the same at all times.

It should also be noted that while the above explanations of the operation of flash memory cells assumes that a cell storing N bits has exactly $2^N$ possible different states (represented by different ranges of its threshold voltage) and that an erase operation brings the cell to the leftmost (lowest voltage) state which also represents one of the $2^N$ data values, there are flash memory devices in which this is not the case. In such devices the erased state is different from all data states. Specifically, the erased state has a more negative threshold voltage than any of the data states. In such devices whenever writing data into the cell, even if the data is the all-ones value, the cell is programmed (that is—its threshold voltage is increased) to reach the state corresponding to the data value. In other words, the erased state is different than the all-ones state, unlike the devices previously referred to. Even though the above explanations of the present invention were given in the context of the first type of devices, the invention is also equally applicable to the second type of devices.

The methods of the present invention can be implemented either by software or by hardware. More specifically, the transformation of the bits (during writing, reading or both) can be implemented by executing software code or by electrical circuitry (such as inverter gates). If the transformation is implemented by software, it may be implemented either by software executed on the host computer which writes or reads the data (for example, within the software device driver supporting the storage device), or it may be implemented by firmware executed within the memory controller (e.g. controller 20 of FIG. 2) that interacts with the host computer and controls the memory media. If the transformation is implemented by hardware, it may be implemented either in the memory controller or within the memory media (e.g. in command circuits 7 of FIG. 2). This applies whether the memory controller and the memory media are two separate dies or reside on a common die. All the above configurations and variations are within the scope of the present invention.

Thus, in addition to illustrating a typical prior art flash memory device, FIG. 2 also illustrates two kinds of embodiments of a flash memory device of the present invention. In a first kind of embodiment, no transformation is applied to the data to be stored in memory array 1. Command circuits 7, upon receiving an all-ones bit pattern to store in a cell of memory cell array 1, instruct state machine 8 to program the cell to a threshold voltage state other than the lowest programmed threshold voltage state. For example, in a two-bit-per-cell device, if the order of the states from left to right is {"00", "01", "11", "10"}, command circuits 7 instruct state machine 8 to program the cell to the third threshold voltage state from the left as illustrated in FIG. 1B. When the stored data later are read from that cell, command circuits 7 interpret the third-from-the-left threshold voltage state of the cell as meaning a bit pattern of all ones. In a second kind of embodiment, controller 20 applies one of the transformations discussed above to incoming data before sending the data to command circuits 7 for programming to memory array 1, and inverts the transformation when receiving read data from command circuits 7.

Figure 3:
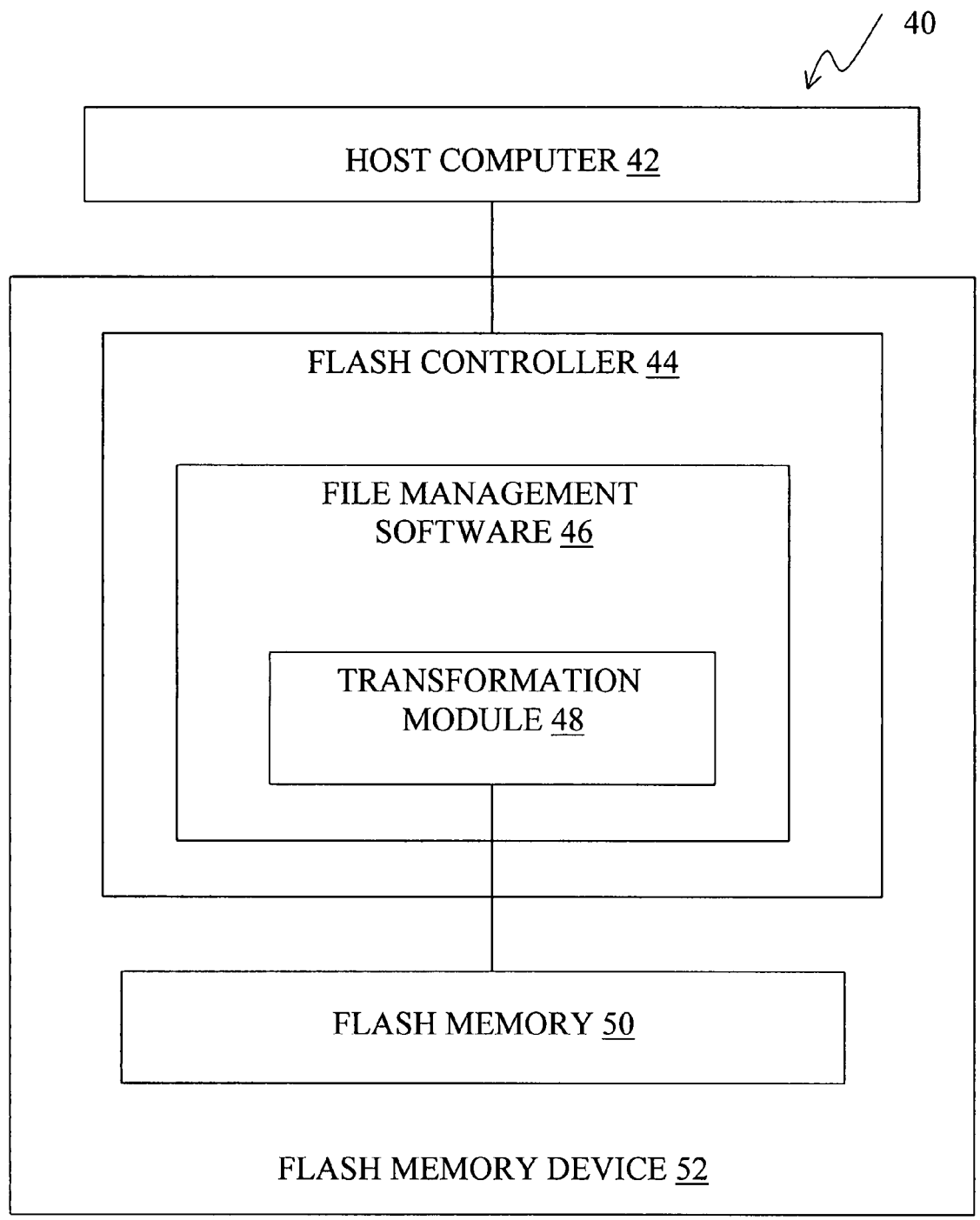
FIGS. 3-5 are high-level block diagrams of systems of the present invention.
Figure 4:
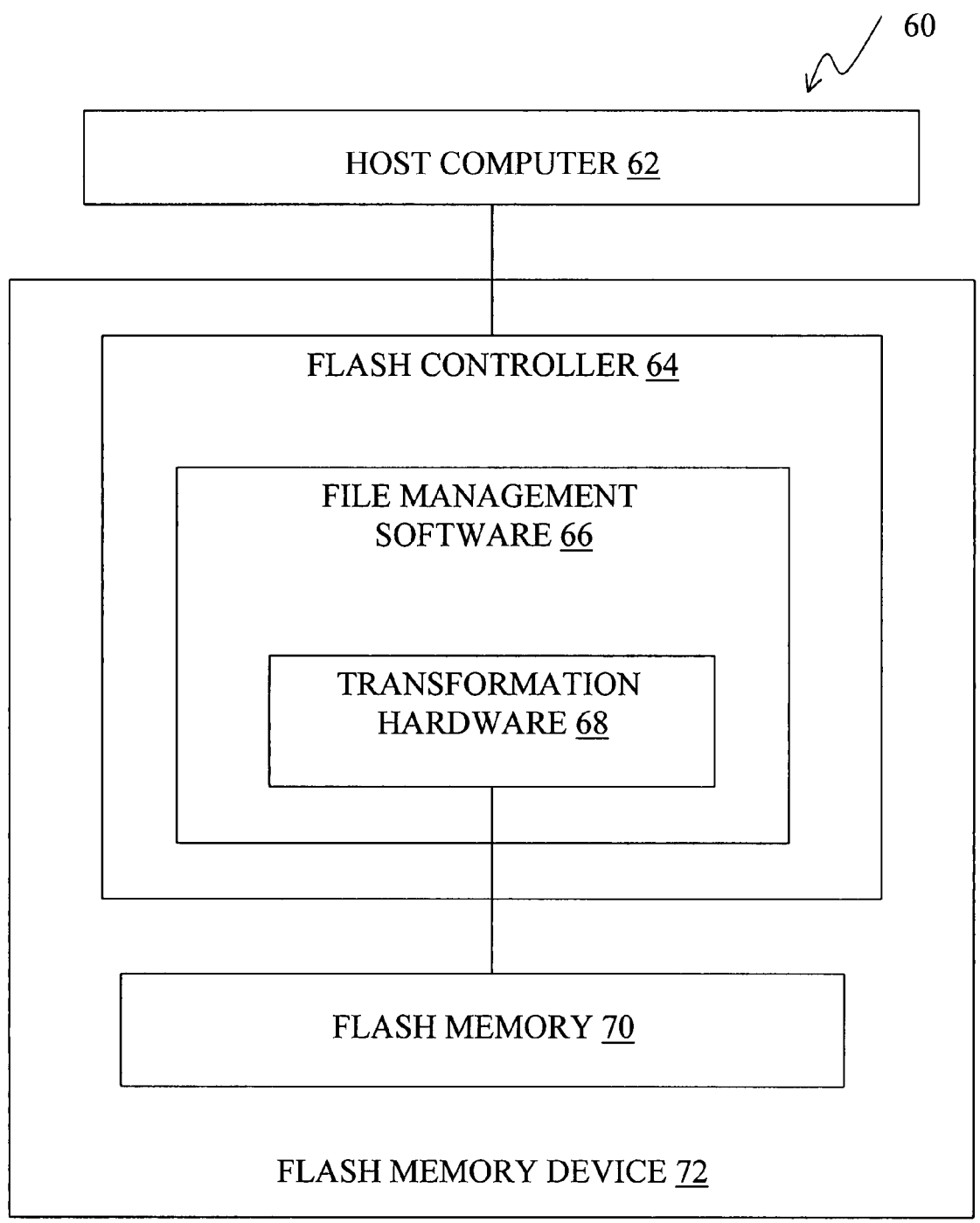

FIGS. 3 and 4 are high-level block diagrams of two systems 40 and 60 that include flash memory device embodiments of the second kind. In system 40, a host computer 42 sends read and write instructions to a flash memory device 52 of the present invention. Flash memory device 52 uses a flash controller 44 to manage a flash memory 50 by executing flash management software 46. Flash management software 46 includes a transformation module 48 for implementing one of the transformations discussed above to data to be stored in flash memory 50 and for inverting the transformation upon reading data from flash memory 50. In system 60, a host computer sends read and write instructions to a flash memory device 72. Flash memory device 72 uses a flash controller 64 to manage a flash memory 70 by executing flash management software 66. When flash controller 64 writes data to flash memory 70, one of the transformations discussed above is applied to the data by transformation hardware 68 in flash controller 64. When flash controller 64 reads data from flash memory 70, transformation hardware 68 applies the inverse of the transformation to the read data.

Figure 5:
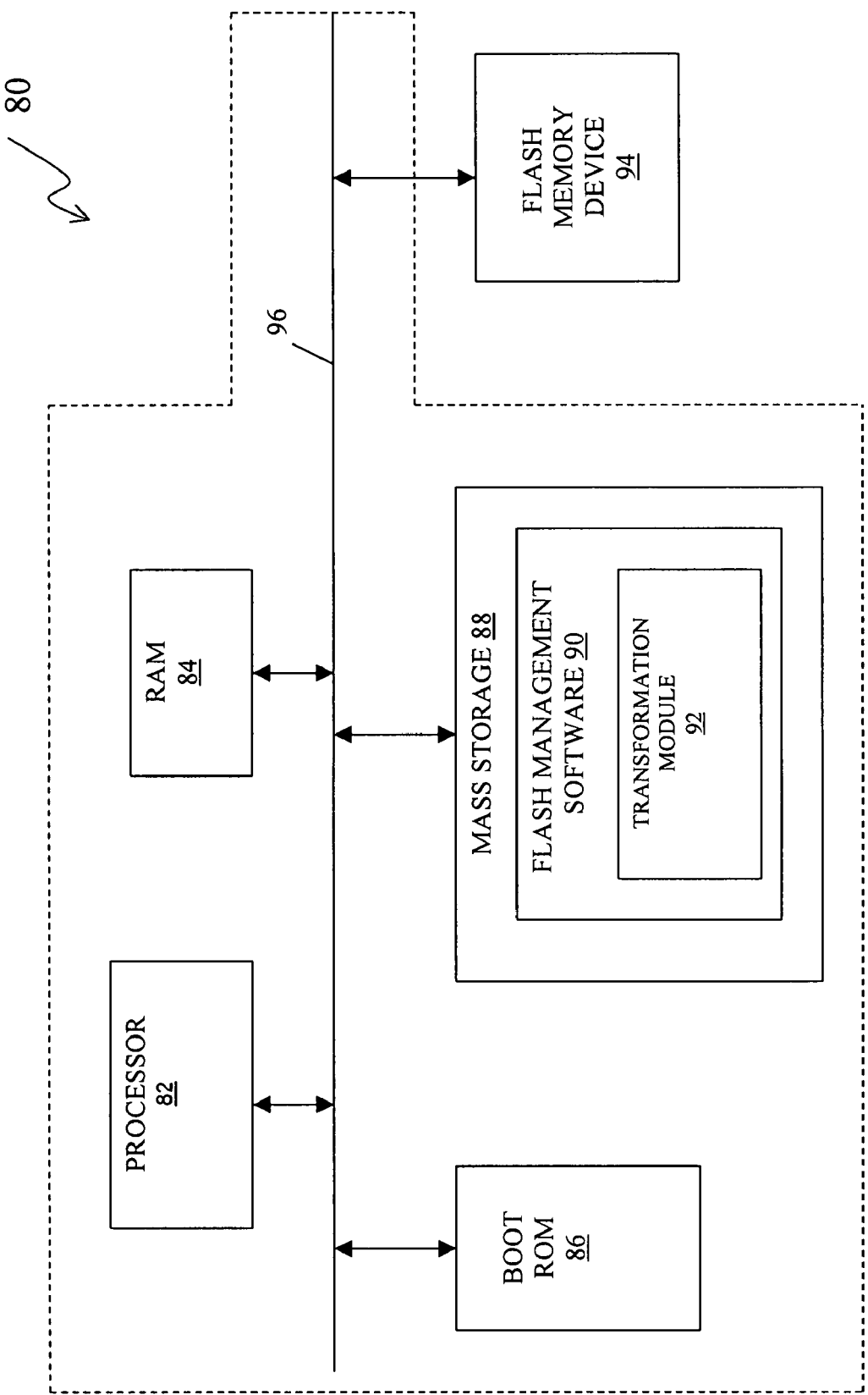

FIG. 5 is a high-level block diagram of another system 80 of the present invention. System 80 includes a processor 82 and four memory devices: a RAM 84, a boot ROM 86, a mass storage device (hard disk) 88 and a prior art flash memory device 94, all communicating via a common bus 60. Flash management software 90 is stored in mass storage device 88 and is executed by processor 82 to manage the flash memory of prior art flash memory device 94. Flash management software 90 includes a transformation module 92 for applying one of the transformations discussed above to data to be stored in flash memory device 94 and for applying the inverse of the transformation to data read from flash memory device 94.

In FIG. 5, the components of system 80 other than flash memory device 94 constitute a host 100 of flash memory device 94. Mass storage device 88 is an example of a computer-readable storage medium bearing computer-readable code for implementing the present invention. Other examples of such computer-readable storage media include read-only memories such as CDs bearing such code.

While the invention has been described with respect to a limited number of embodiments, it will be appreciated that many variations, modifications and other applications of the invention may be made.

What is claimed is:

1. A method of storing data, the method comprising:
    in a memory that includes one or more cells, each cell adapted to be programmed into a corresponding state of a plurality of selectable states, wherein each selectable state has a threshold voltage and a corresponding bit pattern comprising N bits where N is an integer having a value greater than one, mapping, according to a time-invariant transformation, a first cell from a first state having a first threshold voltage and a first bit pattern to a second state having a second threshold voltage and a second bit pattern, wherein:
        the mapping is executed prior to programming the first cell;
        the first threshold voltage is smaller in magnitude than each of the other corresponding threshold voltages of the plurality of selectable states; and
        each bit of the first bit pattern has a value of one; and
    programming the first cell to store N bits of received data.

2. The method of claim 1, wherein each corresponding threshold voltage has a unique value.

3. The method of claim 1, wherein each of the N received bits has a value of one.

4. The method of claim 1, wherein the mapping further comprises inverting each data bit of each cell of the memory.

5. The method of claim 1, wherein the mapping further comprises inverting one bit of the first cell of the memory.

6. The method of claim 1, wherein the first state of the first cell is an erased state of the first cell.

7. The method of claim 6, wherein prior to mapping, the first cell is placed in the erased state of the first cell.

8. A memory device comprising:
    a memory that includes one or more cells, each cell adapted to be programmed into a corresponding state of a plurality of selectable states, wherein each selectable state has a threshold voltage and a corresponding bit pattern comprising N bits where N is an integer having a value greater than one; and
    a mechanism to:
        map, according to a time-invariant transformation, a first cell of the memory from a first state having a first threshold voltage and a first bit pattern to a second state having a second threshold voltage and a second bit pattern, wherein:
            the mapping is executed prior to programming the first cell;
            the first threshold voltage is smaller in magnitude than each of the other corresponding threshold voltages of the plurality of selectable states; and
            each bit of the first bit pattern has a value of one; and
        program the first cell to store N bits of received data.

9. A method of reading data, the data having been previously stored by programming to a selected one of $2^N$ states of a cell including N bits and mapping the selected state to a transformed state having a stored bit pattern, each state having a distinct threshold voltage and a respective one of $2^N$ unique bit patterns, each bit pattern including N bits where N is an integer having a value greater than one, the method comprising:
    defining a time-invariant transformation that maps each bit pattern into a corresponding transformed bit pattern wherein a first bit pattern in which each bit has a value of one and that corresponds to a first state having a first threshold voltage that is lower than each other threshold voltage of the $2^N$ states is mapped to a second state of the $2^N$ states having a second threshold voltage and a second bit pattern; and
    reading the previously stored data by performing an inverse mapping of the stored bit pattern to a read pattern according to an inverse of the time-invariant transformation.

* * * * *

UNITED STATES PATENT AND TRADEMARK OFFICE
CERTIFICATE OF CORRECTION

PATENT NO. : 7,716,415 B2
APPLICATION NO. : 11/797379
DATED : May 11, 2010
INVENTOR(S) : Eran Sharon It is certified that error appears in the above-identified patent and that said Letters Patent is hereby corrected as shown below:

Column 14, Claim 9, Line 30, "pattern into a corresponding transformed bit pattern" should read --pattern into a corresponding transformed bit pattern,--.

Signed and Sealed this

Twenty-third Day of November, 2010

David J. Kappos
*Director of the United States Patent and Trademark Office*